(12) United States Patent
Kim et al.

(10) Patent No.: US 9,425,743 B2
(45) Date of Patent: Aug. 23, 2016

(54) BUFFER AMPLIFIER AND TRANS-IMPEDANCE AMPLIFIER INCLUDING THE SAME

(71) Applicant: Electronics and Telecommunications Research Institute, Daejeon (KR)

(72) Inventors: Young Ho Kim, Sejong (KR); Sang Soo Lee, Daejeon (KR)

(73) Assignee: Electronics and Telecommunications Research Instit, Daejeon (KR)

( * ) Notice: Subject to any disclaimer, the term of this patent is extended or adjusted under 35 U.S.C. 154(b) by 0 days.

(21) Appl. No.: 14/565,939

(22) Filed: Dec. 10, 2014

(65) Prior Publication Data

US 2016/0006395 A1     Jan. 7, 2016

(30) Foreign Application Priority Data

Jul. 7, 2014    (KR) ................ 10-2014-0084322

(51) Int. Cl.
*H03F 3/45*      (2006.01)
*H03F 1/02*      (2006.01)
(Continued)

(52) U.S. Cl.
CPC .............. *H03F 1/0205* (2013.01); *H03F 1/086* (2013.01); *H03F 1/3205* (2013.01); *H03F 1/3211* (2013.01); *H03F 1/56* (2013.01); *H03F 3/45183* (2013.01); *H03F 3/45197* (2013.01); *H03F 3/45748* (2013.01); *H03F 2200/387* (2013.01); *H03F 2200/405* (2013.01); *H03F 2200/453* (2013.01); *H03F 2203/45112* (2013.01); *H03F 2203/45296* (2013.01);
(Continued)

(58) Field of Classification Search
CPC .... H03F 3/45; H03F 2200/06; H03F 2200/09
USPC .......................................... 330/253, 361, 301
See application file for complete search history.

(56) References Cited

U.S. PATENT DOCUMENTS 6,529,075 B2 *   3/2003   Bruck .................... H03F 1/3211
                                           330/251
6,801,080 B1 *   10/2004   Arcus .................. H03K 5/2481
                                           327/379

(Continued)

FOREIGN PATENT DOCUMENTS

KR         100979384 B1     8/2010
KR         101121460 B1     2/2012
KR         101212165 B1     12/2012

OTHER PUBLICATIONS

John A Fisher et. al., A Highly Linear CMOS Buffer Amplifier, IEEE Journal of Solid-State Circuits, Jun. 1987, vol. SC-22, No. 3.

*Primary Examiner* — Steven J Mottola
(74) *Attorney, Agent, or Firm* — William Park & Associates Ltd.

(57) ABSTRACT

Provided is a buffer amplifier. The buffer amplifier includes: a replica bias unit dividing an internal power voltage received from an internal power node to generate a bias voltage; an input unit including a first differential amplifier comparing a first differential input signal with the bias voltage to output a first internal signal and a second differential amplifier comparing a second differential input signal with the bias voltage to output a second internal signal; and an output unit including a third differential amplifier comparing the first internal signal with the second internal signal to output a first differential output signal and a second differential output signal.

16 Claims, 5 Drawing Sheets

(51) Int. Cl.
*H03F 1/56* (2006.01)
*H03F 1/32* (2006.01)
*H03F 1/08* (2006.01)

(52) U.S. Cl.
CPC ............... *H03F 2203/45301* (2013.01); *H03F 2203/45374* (2013.01); *H03F 2203/45644* (2013.01); *H03F 2203/45652* (2013.01); *H03F 2203/45702* (2013.01)

(56) References Cited

U.S. PATENT DOCUMENTS

| | | | |
|---|---|---|---|
| 7,355,451 B2 | 4/2008 | Azadet et al. | |
| 7,605,660 B1 * | 10/2009 | Kobayashi | H03F 1/083 330/254 |
| 2010/0254711 A1 * | 10/2010 | Miller | H03F 3/087 398/136 |

* cited by examiner

BUFFER AMPLIFIER AND TRANS-IMPEDANCE AMPLIFIER INCLUDING THE SAME

CROSS-REFERENCE TO RELATED APPLICATIONS

This U.S. non-provisional patent application claims priority under 35 U.S.C. §119 of Korean Patent Application No. 10-2014-0084322, filed on Jul. 7, 2014, the entire contents of which are hereby incorporated by reference.

BACKGROUND OF THE INVENTION

The present invention disclosed herein relates to an electronic device, and more particularly, to a trans-impedance amplifier including the same.

Typically, an integrated circuit (IC) chip includes a buffer amplifier. The buffer amplifier is provided at the final terminal of the IC, for example, an output terminal. The buffer amplifier is configured to prevent an input impedance of another IC chip from affecting the IC chip, for example, a circuit connected to the final terminal of the IC chip. For example, the buffer amplifier is configured to have low output impedance and high current driving characteristics.

When a buffer amplifier is not provided to the IC chip, voltage drop may occur in the IC chip due to the influence of the another IC chip connected to the final terminal. Accordingly, a signal is not normally delivered to the another IC chip connected to the final terminal and the another IC chip may not perform normal signal processing. Therefore, a buffer amplifier is typically provided to the final terminal of the IC chip.

As an example of the buffer amplifier, suggested are an inverter-type buffer amplifier, an emitter couple logic (ECL)-type buffer amplifier, and a current mode logic (CML)-type buffer amplifier.

The inverter-type buffer amplifier has excellent current driving characteristics. However, since an input impedance and an output impedance of the inverter-type buffer amplifier have high values, the inverter-type buffer amplifier is not suitable for a high-speed operation. Moreover, the inverter-type buffer amplifier consumes a lot of current and it is difficult to apply the inverter-type buffer amplifier to a differential structure.

The ECL-type buffer amplifier has a high linearity and a low output impedance, so that it is advantageous for a high-speed operation. However, the ECL-type buffer amplifier has a low voltage gain. Additionally, when the ECL-type buffer amplifier is manufactured according to a CMOS process, an output signal of the ECL-type buffer amplifier has non-linear characteristics.

The CML-type buffer amplifier has excellent noise attenuation and voltage gain characteristics. However, when a resistor or an inductor is used as a load, the CML-type buffer amplifier increases a design area greatly. Additionally, the CML-type buffer amplifier has poor gain flatness and large voltage drop, so that it cannot raise output voltage.

As an IC chip including a buffer amplifier, there is a trans-impedance amplifier (TIA). The buffer amplifier may be provided at the final terminal of the TIA. The TIA amplifies an optical power signal outputted from a photo diode and delivers it to a limiting amplifier. It is preferred that the TIA delivers a signal with low distortion characteristics without bandwidth limits. However, in order to improve current driving characteristics, if the areas of input transistors in a buffer amplifier of a TIA are designed larger, the bandwidth of the TIA is limited.

An amount of current consumed by a buffer amplifier of a TIA accounts for most of an amount of current consumed by the TIA. Therefore, the feature (for example, change) of an output current of a buffer amplifier affects a chip power of the TIA. For example, the chip power of the TIA may be distorted by the feature (for example, change) of the output current of the buffer amplifier. The chip power of the TIA is provided to other components of the TIA (for example, an input terminal of the TIA). That is, the distortion of the chip power of the TIA may be fed back to the other components of the TIA and due to this, a signal processed by the components of the TIA may be distorted.

SUMMARY OF THE INVENTION

The present invention provides a buffer amplifier having improved signal delivery performance and reduced input capacitance, providing linearity, and having low distortion characteristics and a trans-impedance amplifier including the buffer amplifier.

Embodiments of the present invention provide buffer amplifiers including: a replica bias unit dividing an internal power voltage received from an internal power node to generate a bias voltage; an input unit including a first differential amplifier comparing a first differential input signal with the bias voltage to output a first internal signal and a second differential amplifier comparing a second differential input signal with the bias voltage to output a second internal signal; and an output unit including a third differential amplifier comparing the first internal signal with the second internal signal to output a first differential output signal and a second differential output signal, wherein the first differential amplifier and the second differential amplifier drive the first internal signal and the second internal signal, respectively, by using an external power voltage received from an external power node separated from the internal power node; and the third differential amplifier drives the first differential output signal and the second differential output signal by using the external power voltage.

In some embodiments, the replica bias unit may include: a first transistor having a drain and a gate connected to a first node and a source connected to a second node; a second transistor having a drain and a gate connected to the first node and a source connected to the second node; a resistor connected between the first node and the internal power node; and a current source connected between the second node and a ground node and operating in response to a control voltage, wherein a voltage of the first node may be outputted as the bias voltage.

In other embodiments, the first to third differential amplifiers may operate on the basis of current sources operating in response to the control voltage.

In still other embodiments, the first differential amplifier may include: a first transistor including a drain connected to a first external power node through a first resistor and a second impedance element, a source connected to a ground node through a first current source, and a gate where the first differential input signal is supplied; and a second transistor including a drain connected to a second external power node through a second resistor and a first impedance element, a source connected to the ground node through the first current source, and a gate where the bias voltage is supplied, wherein a signal of the drain of the first transistor and a signal of the drain of the second transistor may be provided as the first internal signal and the second internal signal, respectively.

In even other embodiments, the second differential amplifier may include: a third transistor including a drain connected to the first external power node through the first resistor and the second impedance element, a source connected to the ground node through a second current source, and a gate where the bias voltage is supplied; and a fourth transistor including a drain connected to the second external power node through the second resistor and the first impedance element, a source connected to the ground node through the second current source, and a gate where the second differential input signal is supplied, wherein a signal of the drain of the third transistor and a signal of the drain of the fourth transistors may be provided as the first internal signal and the second internal signal, respectively.

In yet other embodiments, the third differential amplifier may include: a fifth transistor including a drain connected to the second external power node through the first impedance element, a gate connected to the drain of the first transistor and the drain of the third transistor, and a source connected to the ground node through a third current source; and a sixth transistor including a drain connected to the first external power node through the second impedance element, a gate connected to the drain of the second transistor and the drain of the fourth transistor, and a source connected to the ground node through a fourth current source, wherein a signal of the drain of the sixth transistor may be provided as the first differential output signal and a signal of the drain of the fifth transistor may be provided as the second differential output signal.

In further embodiments, the buffer amplifiers may further include a source degeneration impedance element connected to the third differential amplifier, wherein the source degeneration impedance element may include: a third and fourth resistors connected in series between the source of the fifth transistor and the source of the sixth transistor; a first capacitor connected between the source of the fifth transistor and the ground node; and a second capacitor connected between the source of the sixth transistor and the ground node.

In still further embodiments, the replica bias unit may include: a seventh transistor including a drain and a gate connected to a first node and a source connected to a second node; an eighth transistor including a drain and a gate connected to the first node and a source connected to the second node; a resistor connected between the first node and the internal power node; and a current source connected between the second node and the ground node and generating a same amount of positive current as the first current source and the second current source, wherein a size of each of the seventh transistor and the eighth transistor may be identical to a size of each of the first transistor, the second transistor, the third transistor, and fourth transistor.

In even further embodiments, an amount of current flowing through the resistor may be identical to an amount of current flowing through the first resistor and an amount of current flowing through the second resistor.

In yet further embodiments, the first impedance element may have a conjugate output matching value with the second external power node and the second impedance element may have a conjugate output matching value with the first external power node.

In other embodiments of the present invention, a trans-impedance amplifiers include: a trans-impedance amplification device configured to convert a current signal received from an outside into a voltage signal and amplify the converted voltage signal; a single to differential (S2D) amplifier configured to convert the voltage signal into a first differential signal and a second differential signal and amplify the converted signals; a voltage amplifier configured to remove direct current (DC) components of the first differential signal and the second differential signal in response to a first DC-offset cancellation signal and a second DC-offset cancellation signal and amplifying the first differential signal and the second differential signal as a first differential input signal and a second differential input signal; and a buffer configured to output the first differential input signal and the second differential input signal as a first differential output signal and a second differential output signal, wherein the buffer includes: a replica bias unit dividing an internal power voltage received from an internal power node to generate a bias voltage; an input unit including a first differential amplifier comparing the first differential input signal with the bias voltage to output a first internal signal and a second differential amplifier comparing the second differential input signal with the bias voltage to output a second internal signal; and an output unit including a third differential amplifier comparing the first internal signal with the second internal signal to output the first differential output signal and the second differential output signal, wherein the first differential amplifier and the second differential amplifier drive the first internal signal and the second internal signal, respectively, by using an external power voltage received from an external power node separated from the internal power node; and the third differential amplifier drives the first differential output signal and the second differential output signal by using the external power voltage.

In some embodiments, the first differential amplifier may include: a first transistor including a drain connected to a first external power node through a first resistor and a second impedance element, a source connected to a ground node through a first current source, and a gate where the first differential input signal is supplied; and a second transistor including a drain connected to a second external power node through a second resistor and a first impedance element, a source connected to the ground node through the first current source, and a gate where the bias voltage is supplied, wherein a signal of the drain of the first transistor and a signal of the drain of the second transistor may be provided as the first internal signal and the signal of the drain of the first transistor may be provided as the second DC offset cancellation signal.

In other embodiments, the second differential amplifier may include: a third transistor including a drain connected to the first external power node through the first resistor and the second impedance element, a source connected to the ground node through a second current source, and a gate where the bias voltage is supplied; and a fourth transistor including a drain connected to the second external power node through the second resistor and the first impedance element, a source connected to the ground node through the second current source, and a gate where the second differential input signal is supplied, wherein a signal of the drain of the third transistor and a signal of the drain of the fourth transistors may be provided as the second internal signal and the signal of the drain of the fourth transistor may be provided as the first DC-offset cancellation signal.

In still other embodiments, the trans-impedance amplifier, the S2D amplifier, the voltage amplifier, and the buffer may form an integrated circuit chip and the drain of the fifth transistor and the drain of the sixth transistor may be respectively connected to output pads exposed to an outside of the integrated circuit chip.

In even other embodiments, the first external power node and the second external power node may be provided to an outside of the integrated circuit chip; the first impedance element may be connected between the second external power node and an output pad outputting the second differential output signal among the output pads; and the second impedance element may be connected between the first external power node and an output pad outputting the first differential output signal among the output pads.

In yet other embodiments, the internal power voltage may be a power voltage used in the integrated circuit chip; the trans-impedance amplifier, the S2D amplifier, and the voltage amplifier may operate on the basis of the internal power voltage; the external power voltage may be a power voltage supplied from an outside of the integrated circuit chip; and the buffer may be configured to drive the first differential output signal and the second differential output signal by using the external power voltage.

In further embodiments, the voltage amplifier may include a second input unit and a second output unit, wherein the second input unit may include: a first transistor including a drain where the first differential signal is supplied, a gate where the second DC-offset cancellation signal is supplied, and a source connected to a ground node through a first current source; and a second transistor including a drain where the second differential signal is supplied, a gate where the first DC-offset cancellation signal is supplied, and a source connected to the source of the first transistor and connected to the ground node through a second current source, and the second output unit may include: a third transistor including a drain connected to the internal power node through a first resistor, a gate connected to the drain of the first transistor and receiving the first differential signal, and a source connected to the ground node through a third current source; and a fourth transistor including a drain connected to the internal power node through a second resistor, a gate connected to the drain of the second transistor and receiving the second differential signal, and a source connected to the source of the third transistor and connected to the ground node through a fourth current source, wherein a signal of the drain of the fourth transistor may be provided as the first differential input signal and a signal of the drain of the third transistor may be provided as the second differential input signal.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Hereinafter, embodiments of the present invention will be described with reference to the accompanying drawings. Rather, these embodiments are provided so that this disclosure will be thorough and complete, and will fully convey the scope of the inventive concept to those skilled in the art.

Figure 1:
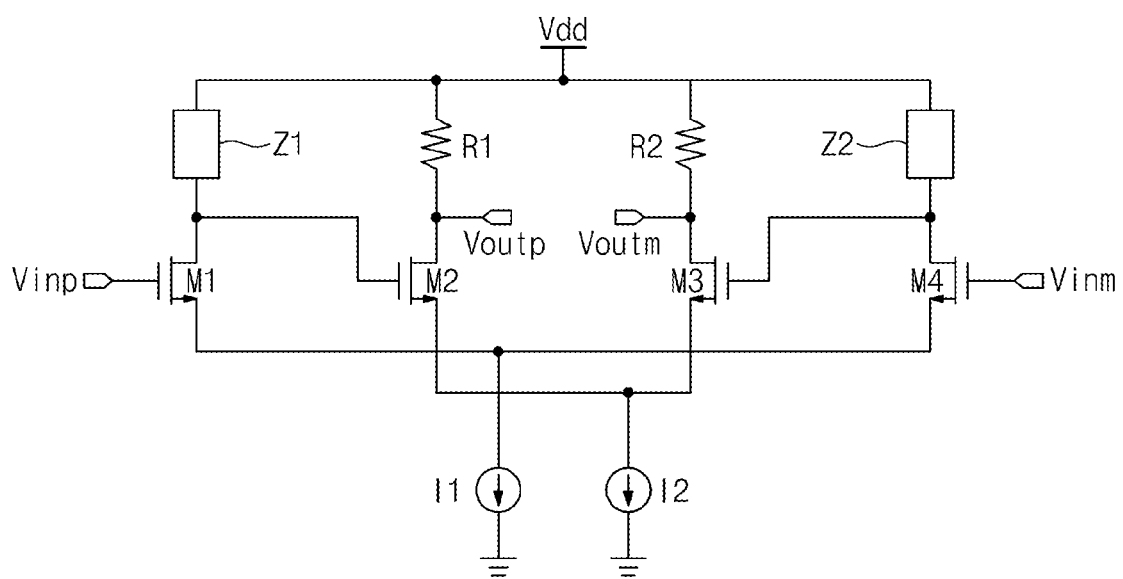
FIG. 1 is circuit diagram illustrating an exemplary buffer amplifier.

FIG. 1 is circuit diagram illustrating an exemplary buffer amplifier 100. Referring to FIG. 1, the buffer amplifier 100 includes first to fourth transistors M1 to M4, first and second current sources I1 and I2, first and second impedance elements Z1 and Z2, and first and second resistance elements R1 and R2.

The first current source I1 is connected between sources of the first and fourth transistors M1 and M4 and a ground node. The second current source I2 is connected between sources of the second and third transistors M2 and M3 and the ground node. The ground node is a node where ground voltage Vss is supplied.

Gates of the first and fourth transistors M1 and M4 are connected to a first input Vinp and a second input Vinm, respectively. The first input Vinp and the second input Vinm may be differential inputs. Drains of the first and fourth transistors M1 and M4 are connected to a power node through the first and second impedance elements Z1 and Z2 and connected to gates of the second and third transistors M2 and M3. Drains of the second and third transistors M2 and M3 are connected to the power node through the first and second resistance elements R1 and R2 and may serve as output nodes where a first output Voutp and a second output Voutm are outputted. The power node is a node where power voltage Vdd is supplied.

The first current source I1 and the first and fourth transistors M1 and M4 relating to the first current source I1 may amplify a difference (for example, voltage difference) between the first input Vinp and the second input Vinm. The second current source I2 and the second and third transistors M2 and M3 relating to the second current source I2 may perform power matching for driving another integrated circuit (IC) chip connected to the output nodes outputting the first output Voutp and the second output Voutm and then, performs current amplification.

In order to perform power matching by using the second current source I2 and the second and third transistors M2 and M3, the first and second resistance elements R1 and R2 connected to the second and third transistors M2 and M3 are configured to have low resistance values. For example, each of the first and second resistance elements R1 and R2 may be configured to have a resistance value about 50 ohms. When the first and second resistance elements R1 and R2 have a low resistance value, an amplification gain achieved by the second current source I2 and the second and third transistors M2 and M3 also have a low value. In order to increase an amplification gain of the buffer amplifier 100, impedance values of the first and second impedance elements Z1 and Z2 are set to allow the first current source I1 and the first and fourth transistors M1 and M4 to have a high gain amplification.

As the first output Voutp and the second output Voutm of the buffer amplifier 100 change, the power voltage Vdd may change. For example, when high current is outputted as the first output Voutp and the second output Voutm, the level of the power voltage Vdd may decrease temporarily. That is, distortion may occur in the power voltage Vdd.

The distortion of the power voltage Vdd may affect the first input Vinp and the second input Vinm. For example, components provided to the front terminal of the buffer amplifier 100 may share the buffer amplifier 100 and the power voltage Vdd. At this point, the distortion of the power voltage Vdd may affect the components provided to the front terminal of the buffer amplifier 100. The distortion of the power voltage Vdd may affect an output of the component provided to the front terminal of the buffer amplifier 100, that is, the first input Vinp and the second input Vinm. At this point, the distortion of the first input Vinp and the second input Vinm may be amplified by the first current source I1 and the first and fourth transistors M1 and M4 and the linearity of the buffer amplifier 100 may be reduced.

The first and fourth transistors M1 and M4 forming the input terminal of the buffer amplifier 100 affect power characteristics of the buffer amplifier 100. For example, as the sizes of the first and fourth transistors M1 and M4 increase, the buffer amplifier 100 may have improved low power characteristics. For example, even when the level of the power voltage Vdd is reduced, the buffer amplifier 100 may operate normally.

As the sizes of the first and fourth transistors M1 and M4 increase, capacitances formed by the gates and channels of the first and fourth transistors M1 and M4 increase. Accordingly, an input capacitance of the buffer amplifier 100 increases. As the input capacitance of the buffer amplifier 100 increases, a bandwidth of the buffer amplifier 100 may reduce.

Figure 2:
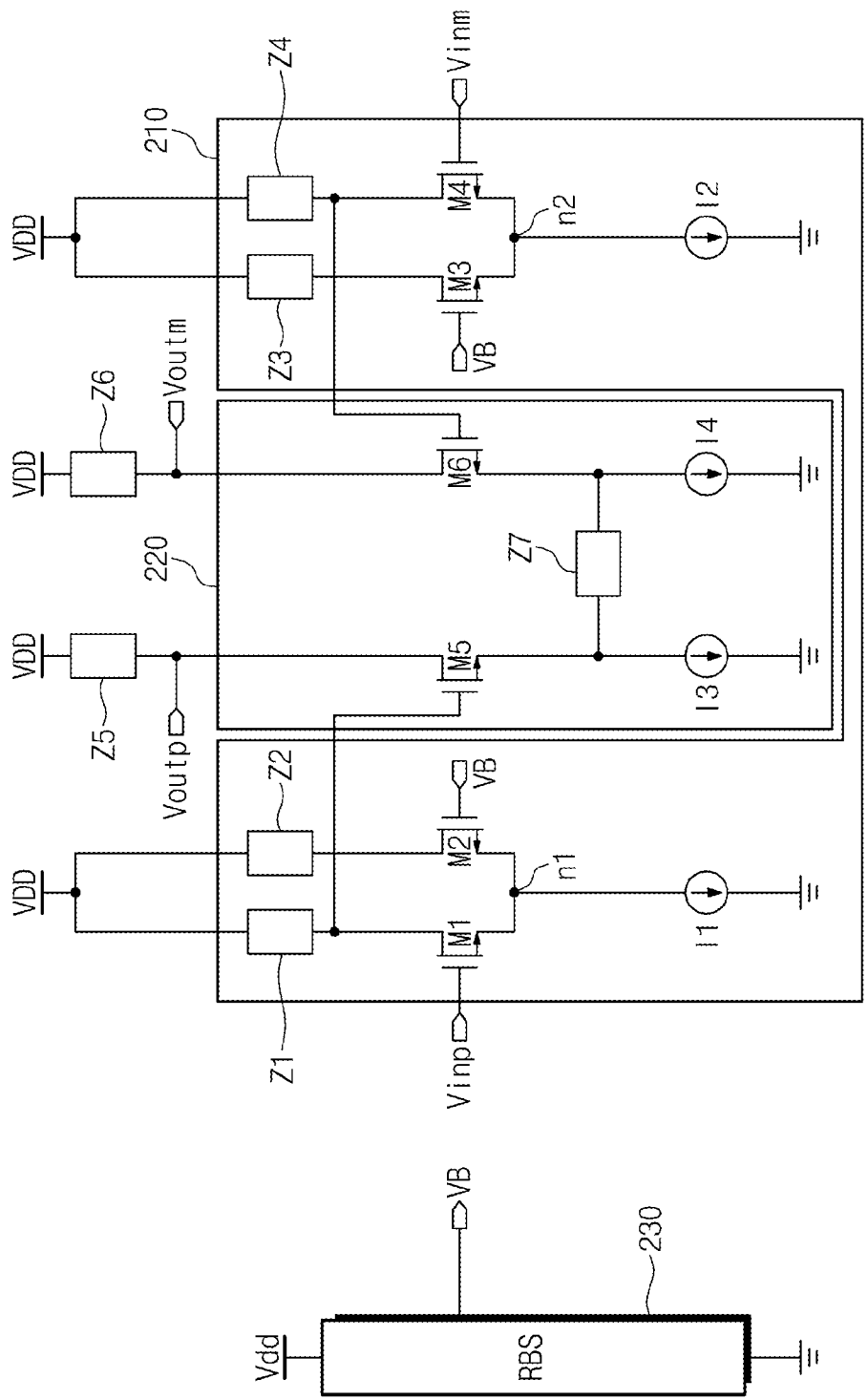
FIG. 2 is a circuit diagram illustrating a buffer amplifier according to an embodiment of the present invention.

FIG. 2 is a circuit diagram illustrating a buffer amplifier 200 according to an embodiment of the present invention. Referring to FIG. 2, the buffer amplifier 200 includes an input terminal 210, an output terminal 220, and a replica bias terminal 230.

The input terminal 210 is configured to receive a first input Vinp and a second input Vinm and amplify the first input Vinp and the second input Vinm. For example, the input terminal 210 may amplify a voltage difference between the first input Vinp and the second input Vinm. The input terminal 210 is configured to have high amplification gain and low input capacitance.

The output terminal 220 is configured to process a signal amplified by the input terminal 210 and output the processed signal as a first output Voutp and a second out Voutm. The output terminal 220 is configured to perform output matching with another IC chip connected to output nodes outputting the first output Voutp and the second output Voutm. Additionally, the output terminal 220 is configured to increase the linearity of the buffer amplifier 200.

The replica bias terminal 230 is configured to generate a bias voltage VB. The replica bias terminal 230 is configured to provide the bias voltage VB to the input terminal 210 and the output terminal 220. The bias voltage VB may be a DC voltage. By using the bias voltage VB, the input terminal 210 and the output terminal 220 may amplify the first input Vinp and the second input Vinm as the first output Voutp and the second output Voutm.

The input terminal 210 includes first and second current sources I1 and I2, first to fourth transistors M1 to M4, and first to sixth impedance elements Z1 to Z6.

The first current source I1 is connected between a ground node and a first node n1. The ground node is a node where ground voltage Vss is supplied.

Sources of the first and second transistors M1 and M2 are commonly connected to the first node n1. The first input Vinp is supplied to a gate of the first transistor M1. The bias voltage VB is supplied to a gate of the second transistor M2. A drain of the first transistor M1 is connected to an external power node through the first impedance element Z1. A drain of the second transistor M2 is connected to the external power node through the second impedance element Z2. The external power node is a node where external power voltage VDD is supplied directly. The drain of the first transistor M1 is connected, as a first output node of the input terminal 210, to the output terminal 220.

The second current source I2 is connected between the ground node and a second node n2. Sources of the third and fourth transistors M3 and M4 are commonly connected to the second node n2. The bias voltage VB is supplied to a gate of the third transistor M3. The second input Vinm is supplied to a gate of the fourth transistor M4. A drain of the third transistor M3 is connected to the external power node through the third impedance element Z3. A drain of the fourth transistor M4 is connected to the external power node through the fourth impedance element Z4. The drain of the fourth transistor M4 is connected, as a second output node of the input terminal 210, to the output terminal 220.

The first current source I1 and the first and second transistors M1 and M2 are configured to amplify a difference between the first input Vinp and the bias voltage VB. The second current source I2 and the third and fourth transistors M3 and M4 are configured to amplify a difference between the second input Vinm and the bias voltage VB. That is, the input terminal 210 may amplify a voltage difference between the first input Vinp and the second input Vinm by using the bias voltage as a medium.

A first capacitance formed by the gate and a channel of the first transistor M1 and a second capacitance formed by the gate and a channel of the second transistor M2 are connected in serial between the gate of the first transistor M1 where the first input Vinp is supplied and the gate of the second transistor M2 where the bias voltage VB is supplied. The gate of the second transistor M2 is connected to the ground node of the replica bias terminal 230 through the node of the replica bias terminal 230 supplying the bias voltage VB. That is, the first capacitance and the second capacitance are connected in series between the node where the first input Vinp is supplied and the ground node. Due to this, the input capacitance of the buffer amplifier 200 seen from the node where the first input Vinp is supplied is less than the first capacitance. For example, when the first and second transistors M1 and M2 have the same size, the first and second capacitances may have the same value and an input capacitance may be ½ of the first capacitance.

In the same manner, A fourth capacitance formed by the gate and a channel of the fourth transistor M4 and a third capacitance formed by the gate and a channel of the third transistor M3 are connected in serial between the gate of the fourth transistor M4 where the second input Vinm is supplied and the gate of the third transistor M3 where the bias voltage VB is supplied. The gate of the third transistor M3 is connected to the ground node of the replica bias terminal 230 through the node of the replica bias terminal 230 supplying the bias voltage VB. That is, the fourth capacitance and the third capacitance are connected in series between the node where the second input Vinm is supplied and the ground node. Due to this, the input capacitance of the buffer amplifier 200 seen from the node where the second input Vinm is supplied is less than the fourth capacitance. For example, when the third and fourth transistors M3 and M4 have the same size, the third and fourth capacitances may have the same value and an input capacitance may be ½ of the fourth capacitance.

Moreover, referring to FIG. 1, the first input Vinp and the second input Vinm are supplied to the gates of the first and fourth transistors M1 and M4. Since the first input Vinp and the second input Vinm are differential signals, the sources of the first and fourth transistors M1 and M4 serve as a virtual ground. Therefore, in the buffer amplifier 100 of FIG. 1, an input capacitance seen from the node where the first input Vinp is supplied may be a capacitance formed by the first transistors M1. Additionally, in the buffer amplifier 100 of FIG. 1, an input capacitance seen from the node where the second input Vinm is supplied may be a capacitance formed by the fourth transistors M4.

Accordingly, compared to the buffer amplifier 100 described with reference to FIG. 1, the buffer amplifier 200 has a reduced input capacitance while maintaining the same amplification gain. Accordingly, a bandwidth of the buffer amplifier 200 extends and the operation performance of the buffer amplifier 200 is improved.

The output terminal 220 includes third and fourth current sources I3 and I4, and fifth and sixth transistors M5 and M6.

The third current source I3 is connected between a source of the fifth transistor M5 and the ground node. The fourth current source I4 is connected between a source of the sixth transistor M6 and the ground node.

A gate of the fifth transistor M5 is connected to a drain of the first transistor M1 of the input terminal 210. A source of the fifth transistor M5 is connected between a third current source I3 and a seventh impedance element Z7. A drain of the fifth transistor M5 may be connected to the external power node through the fifth impedance element Z5 and may output the first output Voutp. The fifth impedance element Z5 may have a conjugate output matching value with the external power node.

A gate of the sixth transistor M6 is connected to a drain of the fourth transistor M4 of the input terminal 210. A source of the sixth transistor M6 is connected to the fourth current source I4 and the seventh impedance element Z7. A drain of the sixth transistor M6 may be connected to the external power node through the sixth impedance element Z6 and may output the second output Voutm. The sixth impedance element Z6 may have a conjugate output matching value with the external power node.

The seventh impedance element Z7 may be connected between the fifth and sixth transistors M5 and M6 and may be a source degeneration impedance element. The second impedance element Z7 may compensate for the asymmetry of signals generated as the bias voltage VB is introduced to the input terminal 210 and may improve the linearity of the buffer amplifier 200. Additionally, the seventh impedance element Z7 may provide a boosting function so that the output terminal 200 further amplifies a signal in a high frequency band.

In the buffer amplifier 200, the first and second impedance elements Z1 and Z2 may be connected to a first external power node. The first external power node may be a node where the external power voltage VDD is supplied from the outside of an IC chip that the buffer amplifier 200 belongs. The first external power node may not supply the external power voltage VDD to another component of the buffer amplifier 200 or the IC chip that the buffer amplifier 200 belongs and may supply the external power voltage VDD only to the first and second impedance elements Z1 and Z2. The first external power node may be a pad exposed to the outside of the IC chip that the buffer amplifier 200 belongs and connected to a wire delivering the external power voltage VDD.

The third and fourth impedance elements Z3 and Z4 may be connected to a second external power node. The second external power node may be a node separated from the first external power node. The second external power node may be a pad provided separated from the first external power node, exposed to the outside of the IC chip that the buffer amplifier 200 belongs, and connected to a wire delivering the external power voltage VDD.

The fifth impedance element Z5 may be connected to a third external power node. The third external power node may be a node separated from the first and second external power nodes. The third external power node may be a pad provided separated from the first and second external power nodes, exposed to the outside of the IC chip that the buffer amplifier 200 belongs, and connected to a wire delivering the external power voltage VDD.

The sixth impedance element Z6 may be connected to a fourth external power node. The fourth external power node may be a node separated from the first to third external power nodes. The fourth external power node may be a pad provided separated from the first to third external power nodes, exposed to the outside of the IC chip that the buffer amplifier 200 belongs, and connected to a wire delivering the external power voltage VDD.

That is, powers required by the buffer amplifier 200 are supplied from an external device of an IC chip that the buffer amplifier 200 directly and in parallel, and are not shared by any components of the IC chip. Accordingly, a distortion, caused by the buffer amplifier, of chip power of the IC chip that the buffer amplifier 200 belongs is prevented and the linearity of the buffer amplifier 200 and the IC chip that the buffer amplifier 200 belongs is improved.

Figure 3:
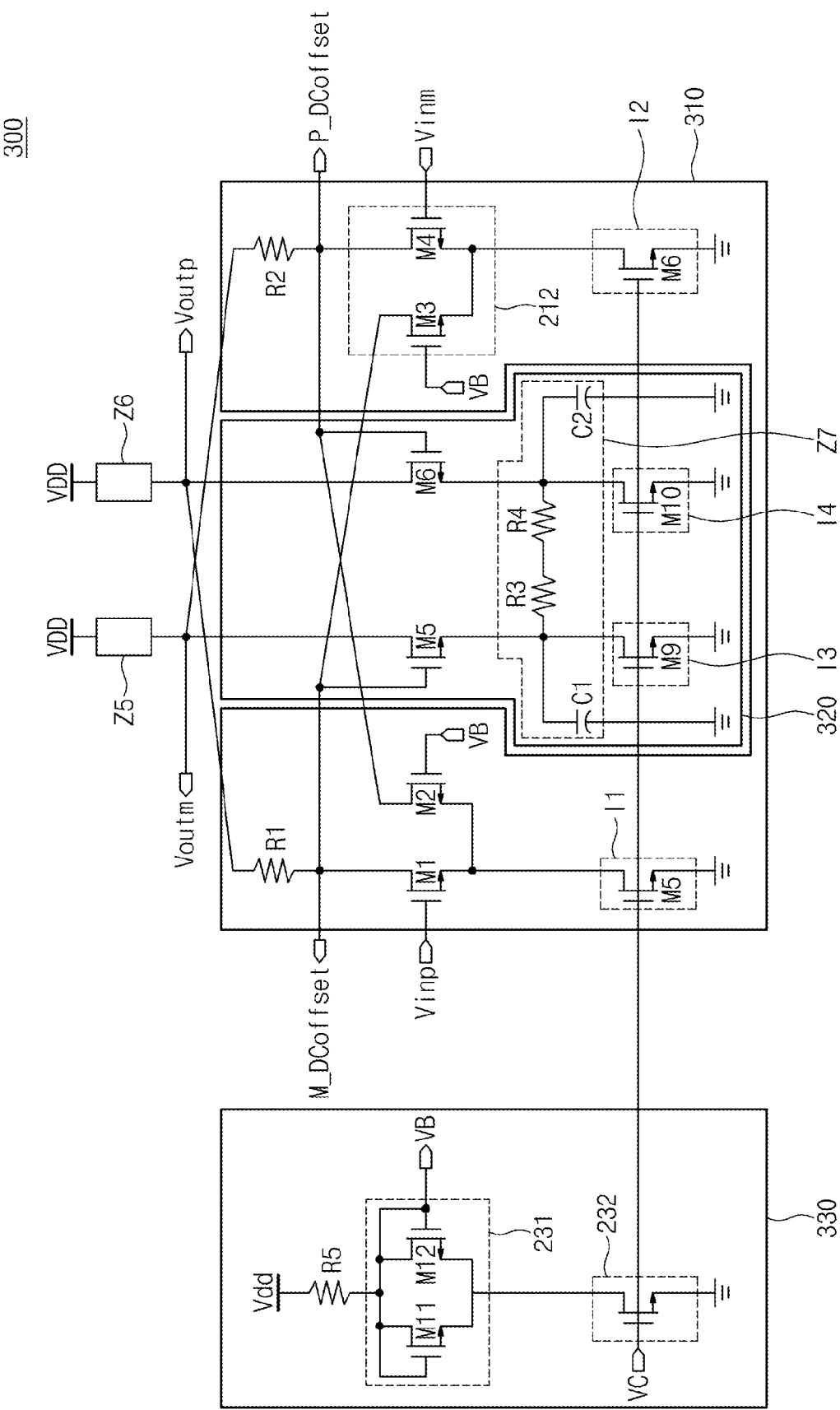
FIG. 3 is a circuit diagram illustrating a buffer amplifier according to another embodiment of the present invention.

FIG. 3 is a circuit diagram illustrating a buffer amplifier 300 according to another embodiment of the present invention. Referring to FIG. 3, the buffer amplifier 300 includes an input terminal 310, an output terminal 320, and a replica bias terminal 330.

The input terminal 310 is configured to receive a first input Vinp and a second input Vinm and amplify the first input Vinp and the second input Vinm. For example, the input terminal 310 may amplify a voltage difference between the first input Vinp and the second input Vinm. The input terminal 310 is configured to have high amplification gain and low input capacitance.

The output terminal 320 is configured to process a signal amplified by the input terminal 310 and output the processed signal as a first output Voutp and a second out Voutm. The output terminal 320 is configured to perform output matching with another IC chip connected to output nodes outputting the first output Voutp and the second output Voutm. Additionally, the output terminal 320 is configured to increase the linearity of the buffer amplifier 300.

The replica bias terminal 330 is configured to generate a bias voltage VB. The replica bias terminal 330 is configured to provide the bias voltage VB to the input terminal 310 and the output terminal 320. The bias voltage VB may be a DC voltage. By using the bias voltage VB, the input terminal 310 and the output terminal 320 may amplify the first input Vinp and the second input Vinm as the first output Voutp and the second output Voutm.

The input terminal 310 include first and second current sources I1 and I2 and first and second resistors R1 and R2.

The first current source I1 is commonly connected sources of the first and second transistors M1 and M2. The first current source I1 includes a transistor operating in response to a control voltage VC.

The first input Vinp is supplied to a gate of the first transistor M1. The source of the first transistor M1 is connected to the first current source I1 and the source of the second transistor M2. A drain of the first transistor M1 is connected to the first resistor R1, a drain of the third transistor M3, and a gate of a fifth transistor M5 of the output terminal 320. A signal of the drain of the first transistor M1 is delivered to the output terminal 320 as a first output of the input terminal 310. Additionally, a signal of the drain of the first transistor M1 may be outputted to the outside as a first offset control signal M_DCoffset.

The bias voltage VB is supplied to a gate of the second transistor M2. The source of the second transistor M2 is connected to the first current source I1 and the source of the first transistor M1. A drain of the second transistor M2 is connected to a gate of a sixth transistor M6 of the output terminal 320.

A first terminal of the first resistor R1 is connected to the drain of the first transistor M1, the drain of the third transistor M3, and a gate of the fifth transistor M5. A second terminal of the first resistor R1 is connected to a sixth impedance element Z6 of the output terminal 330 and is connected to a drain of the sixth transistor M6. A signal of the second terminal of the first resistor R1 may be outputted as the first output Voutp.

The second current source I2 is commonly connected sources of the third and fourth transistors M3 and M4. The second current source I2 includes a transistor operating in response to the control voltage VC.

The second input Vinm is supplied to a gate of the fourth transistor M4. The source of the fourth transistor M4 is connected to the second current source I2 and the source of the third transistor M3. A drain of the fourth transistor M4 is connected to the second resistor R2, the drain of the second transistor M2, and the gate of the sixth transistor M6 of the output terminal 330. A signal of the drain of the fourth transistor M4 is delivered to the output terminal 320 as a second output of the input terminal 310. Additionally, a signal of the drain of the fourth transistor M4 may be outputted to the outside as a second offset control signal P_DCoffset.

The bias voltage VB is supplied to a gate of the third transistor M3. The source of the third transistor M3 is connected to the second current source I2 and the source of the fourth transistor M4. The drain of the third transistor M3 is connected to the gate of the fifth transistor M5 of the output terminal 320.

A first terminal of the second resistor R2 is connected to the drain of the fourth transistor M4, the drain of the second transistor M2, and the gate of the sixth transistor M6. A second terminal of the second resistor R2 is connected to a fifth impedance element Z5 of the output terminal 330 and is connected to a drain of the fifth transistor M5. A signal of the second terminal of the second resistor R2 may be outputted as the second output Voutm.

The output terminal 320 includes third and fourth current sources I3 and I4, the fifth and sixth transistors M5 and M6, and a seventh impedance element Z7.

The third current source I3 is connected between a source of the fifth transistor M5 and a ground node. The third current source I3 includes a transistor operating in response to the control voltage VC. The fourth current source I4 is connected between a source of the sixth transistor M6 and the ground node. The fourth current source I4 includes a transistor operating in response to the control voltage VC.

The source of the fifth transistor M5 is connected to the third current source I3 and the seventh impedance element Z7. The gate of the fifth transistor M5 is connected to the drain of the first transistor M1 and the drain of the third transistor M3 of the input terminal 310. The drain of the fifth transistor M5 is connected to the second terminal of the second resistor R2 and connected to the external power node through the fifth impedance element Z5. A signal of the drain of the fifth transistor M5 may be outputted as the second output Voutm.

The source of the sixth transistor M6 is connected to the fourth current source I4 and the seventh impedance element Z7. The gate of the sixth transistor M6 is connected to the drain of the second transistor M2 and the drain of the fourth transistor M4. The drain of the sixth transistor M6 is connected to the second terminal of the first resistor R1 and connected to the external power node through the sixth impedance element Z6.

Referring to FIGS. 2 and 3, the output terminal 320 may have the same structure as the output terminal 220 of FIG. 2 and may operate in the same manner.

The first resistor R1 and the sixth impedance element Z6 connected in serial between the first transistor M1 of the input terminal 310 and the external power node may correspond to the first impedance element Z1 of the input terminal 210. The second resistor R2 and the fifth impedance element Z5 connected in serial between the second transistor M2 of the input terminal 310 and the external power node may correspond to the second impedance element Z2 of the input terminal 210. The first resistor R1 and the sixth impedance element Z6 connected in serial between the third transistor M3 of the input terminal 310 and the external power node may correspond to the third impedance element Z3 of the input terminal 210. The second resistor R2 and the fifth impedance element Z5 connected in serial between the fourth transistor M4 of the input terminal 310 and the external power node may correspond to the fourth impedance element Z4 of the input terminal 210.

The first and second transistors M1 and M2 of the input terminal 310 form a first differential amplifier. The third and fourth transistors M3 and M4 of the input terminal 310 form a second differential amplifier. The first differential amplifier amplifies a difference between the first input Vinp and the bias voltage VB and the second differential amplifier amplifies a difference between the second input Vinm and the bias voltage VB. The first differential amplifier and the second differential amplifier are cross-connected to each other. The first differential amplifier and the second differential amplifier are configured to cross each other and reuse current. Accordingly, compared to the buffer amplifier 200, the current consumption of the buffer amplifier 300 is less.

Additionally, the first differential amplifier forms a part of an amplification gain and the second differential amplifier forms a remaining of the amplification gain in a cross-dividing way. Accordingly, the first differential amplifier and the second differential amplifier operate as a single differential amplifier so that symmetric characteristics of the input terminal 310 is improved. That is, compared to the buffer amplifier 200, the linearity of the buffer amplifier 300 is further excellent.

The buffer amplifier 200 uses four external power nodes but the buffer amplifier 300 uses two external power nodes. Accordingly, compared to the buffer amplifier 200, the number of pins in an IC chip including the buffer amplifier 300 is reduced.

The seventh impedance element Z7 may be a source degeneration impedance element. The seven impedance element Z7 includes third and fourth resistors R3 and R4 connected in series between the source of the fifth transistor M5 and the source of the sixth transistor M6, a first capacitor C1 connected between the source of the fifth transistor M5 and the ground node, and a second capacitor C2 connected between the source of the sixth transistor M6 and the ground node. The first and second capacitors C1 and C2 have low impedances in a high frequency band. That is, the impedance of the seventh impedance element Z7 may be high in a low frequency area and may be low in a high frequency area. That is, the seventh impedance element Z7 may provide an amplification gain higher than an amplification gain of a low frequency band in a high frequency band. When a frequency (for example, a frequency at which degeneration peaking occurs) at which the seventh impedance element Z7 boosts an amplification gain is matched to the edge of a bandwidth of the buffer amplifier 300, the bandwidth of the buffer amplifier 300 may be increased. For example, a frequency of the seventh impedance element Z7 (for example, a frequency at which degeneration peaking occurs) may be defined by the resistance values of the third and fourth resistors R3 and R4 and the capacitances of the first and second capacitances C1 and C2.

Figure 4:
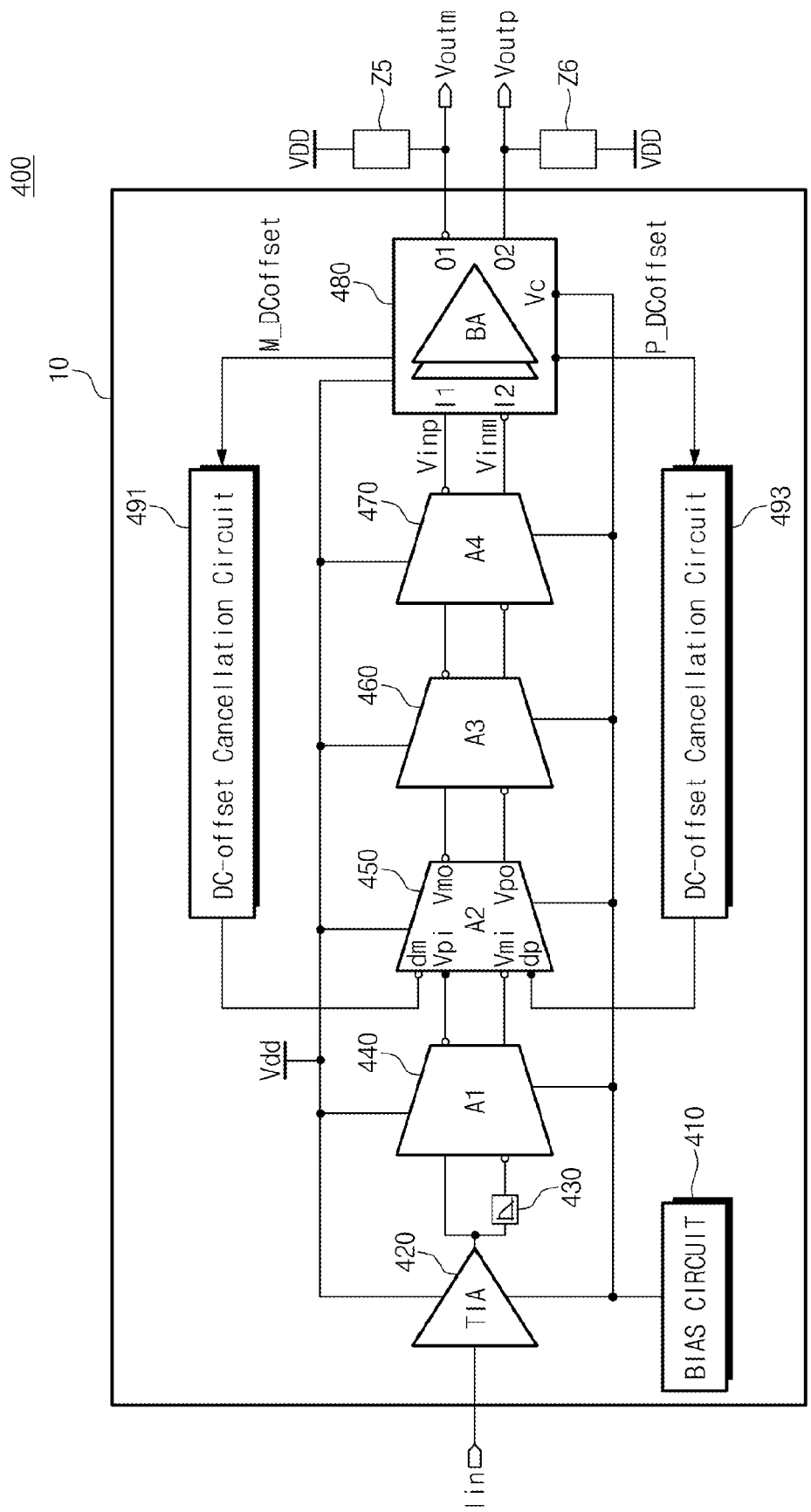
FIG. 4 is a circuit diagram illustrating a trans-impedance amplifier according to an embodiment of the present invention.

FIG. 4 is a circuit diagram illustrating a TIA 400 according to an embodiment of the present invention. The TIA 400 amplifies an optical power signal outputted from a photo diode and delivers it to a limiting amplifier. Referring to FIG. 4, the TIA 400 includes a bias circuit 410, a trans-impedance amplification device 420, a low pass filter 430, voltage amplifiers 440 to 470, a buffer amplifier 480, DC-offset cancellation circuits 491 and 493, and impedance elements Z5 and Z6.

The bias circuit 410, the trans-impedance amplification device 420, the low pass filter 430, the voltage amplifiers 440 to 470, the buffer amplifier 480, the DC-offset cancellation circuits 491 and 493, and the impedance elements Z5 and Z6 may be included in one IC chip 10. The trans-impedance amplification device 420 may form an input terminal of the IC chip 10 and the buffer amplifier 480 may form an output terminal of the IC chip 10.

The bias circuit 410, the trans-impedance amplification device 420, the amplifiers 440 to 470, and the buffer amplifier 480 receive internal power voltage Vdd generated from the inside of the IC chip 10. Additionally, the buffer amplifier 480 receives external power voltage VDD through an external power node.

The bias circuit 410 generates a control voltage VC in order for mirroring a reference current. By using the control voltage VC, a mirrored current may be generated at each component of the trans-impedance amplifier 400.

The trans-impedance amplification device 420 receives a current signal Iin from an external device (for example, a photodiode). The trans-impedance amplification device 420 converts the received current signal Iin into a voltage signal and amplifies it, and then outputs the amplified signal to the low pass filter 430 and the first voltage amplifier 440.

The low pass filter 430 and the first voltage amplifier 440 may form a single to differential (S2D) amplifier. In the S2D amplifier, a single input signal is converted into differential output signals Vpi and Vmi. For example, an output of the trans-impedance amplification device 420 is directly delivered to a positive input terminal of the first voltage amplifier 440. A signal obtained by filtering an output of the trans-impedance amplification device 420 through the low pass filter 430 is delivered to a negative input terminal of the first voltage amplifier 440. The low pass filter 430 extracts a DC component from an output of the trans-impedance amplification device 420 and delivers the extracted DC component to the negative input terminal of the first voltage amplifier 440. The first voltage amplifier 440 may output differential output signals Vpi and Vmi by comparing an output of the trans-impedance amplification device 420 with a DC component of an output of the trans-impedance amplification device 420. The differential output signals Vpi and Vmi are delivered to the second voltage amplifier 450.

The second voltage amplifier 450 amplifies the differential output signals Vpi and Vmi received from the first voltage amplifier 440. The second voltage amplifier 450 outputs the amplified differential signals Vmo and Vpo to the third voltage amplifier 460. Herein, the second voltage amplifier 450 removes a DC-offset component of the received differential signals Vpi and Vmi in response to DC-offset cancellation signals dm and dp outputted from the DC-offset cancellation circuits 491 and 493.

The third voltage amplifier 460 amplifies the differential signals Vmo and Vpo outputted from the second voltage amplifier 450. The third voltage amplifier 450 outputs the amplified differential signals to the fourth voltage amplifier 470.

The fourth voltage amplifier 470 amplifies the differential signals outputted from the third voltage amplifier 460. The signals amplified by the fourth voltage amplifier 470 are delivered as differential input signals Vinp and Vinm to the buffer amplifier 480.

Herein, the number of the first voltage amplifier 440 to the fourth voltage amplifier 470 is just exemplary and thus the present invention is not limited thereto. According to an amplification gain required from the trans-impedance amplifier 400, at least one voltage amplifier may be provided inside the trans-impedance amplifier 400. Additionally, in order to remove a DC-offset, the number of voltage amplifiers may be changed and inputs of the voltage amplifiers may be adjusted in consideration of the phases of DC-offset cancellation signals dp and dm.

The buffer amplifier 480 includes two input terminals I1 and I2 receiving differential input signals Vinp and Vinm and two output terminals O1 and O2 outputting differential output signals Voutp and Voutm. The buffer amplifier 480 amplifies differential input signals Vinp and Vinm outputted from the fourth voltage amplifier 470 to generate differential output signals Voutp and Voutm. The differential output signals Voutp and Voutm are outputted to an external device of the trans-impedance amplifier 400, for example, an external IC device. In order to optimize a power signal transfer rate to an external device, the buffer amplifier 480 may perform power matching (for example, conjugate matching) of an output signal. Additionally, since the differential output signals Voutp and Voutm are driven by using the external power voltage VDD supplied from external power nodes, the buffer amplifier 480 may prevent the internal power Vdd of the IC chip 10 from being distorted due to the differential output signals Voutp and Voutm.

For example, the buffer amplifier 480 may include the buffer amplifier 200 described with reference to FIG. 2 or the buffer amplifier 300 described with reference to FIG. 3. The impedance elements Z5 and Z6 connected between the output terminals O1 and O2 of the buffer amplifier 480 and external power nodes may correspond to the fifth and sixth impedance elements Z5 and Z6 described with reference to FIG. 2 or FIG. 3.

The impedance elements Z5 and Z6 are not included in the IC chip 10 and disposed at the outside. When the impedance elements Z5 and Z6 are provided at the outside of the IC chip 10, the size of the IC chip 10 is reduced.

The impedances of the impedance elements Z5 and Z6 may be determined by input impedance of an external device receiving the differential output signals Voutp and Voutm, for example, a limiting amp. For example, the impedances of the impedance elements Z5 and Z6 may be determined to achieve impedance matching with an input impedance of the limiting amp. When the impedance elements Z5 and Z6 are provided at the outside of the IC chip 10, their impedances may be corrected easily so that impedance matching becomes easy. For example, by only connecting the impedance elements Z5 and Z6 having impedances necessary for impedance matching to the IC chip 10, impedance matching may be achieved.

The IC chip 10 may include two output pads outputting differential output signals Voutp and Voutm. The two output pads of the IC chip 10 are connected to the external power node through the impedance elements Z5 and Z6. The IC chip 10 may drive the differential output signals Voutp and Voutm by using the external power voltage VDD supplied from external power nodes connected to the output pads. That is, the IC chip 10 outputs the differential output signals Voutp and Voutm through the output pads and also receive power for driving the differential output signals Voutp and Voutm through the output pads. Accordingly, once the impedance elements Z5 and Z6 are provided to the outside of the IC chip 10, even when the IC chip 10 uses the external power voltage VDD, the number of pads of the IC chip 10 may not increase and the area of the IC chip 10 may be minimized.

The first DC-offset cancellation circuit 491 receives a first offset cancellation signal M_DCoffset from the buffer amplifier 480 and outputs the DC-offset cancellation signal dm to the second voltage amplifier 450. For example, the first DC-offset cancellation circuit 491 may perform low pass filtering on the first offset cancellation signal M_DCoffset to extract a DC component. The first DC-offset cancellation circuit 491 may output the extracted DC component as a DC-offset cancellation signal dm.

The second DC-offset cancellation circuit 493 receives a second offset cancellation signal P_DCoffset from the buffer amplifier 480 and outputs the DC-offset cancellation signal dp to the second voltage amplifier 450. For example, the second DC-offset cancellation circuit 493 may perform low pass filtering on the second offset cancellation signal P_DCoffset to extract a DC component. The second DC-offset cancellation circuit 493 may output the extracted DC component as a DC-offset cancellation signal dp.

Although it is described with reference to FIG. 4 the DC-offset cancellation circuits 491 and 493 delivers the DC-offset cancellation signals dp and dm to the second voltage amplifier 450, the technical idea of the present invention is not limited thereto. The DC-offset cancellation circuits 491 and 493 may remove a DC-offset of an input signal of the trans-impedance amplifier 400 by transmitting the DC-offset cancellation signals dp and dm to one of voltage amplifiers provided to the trans-impedance amplifier 400.

Figure 5:
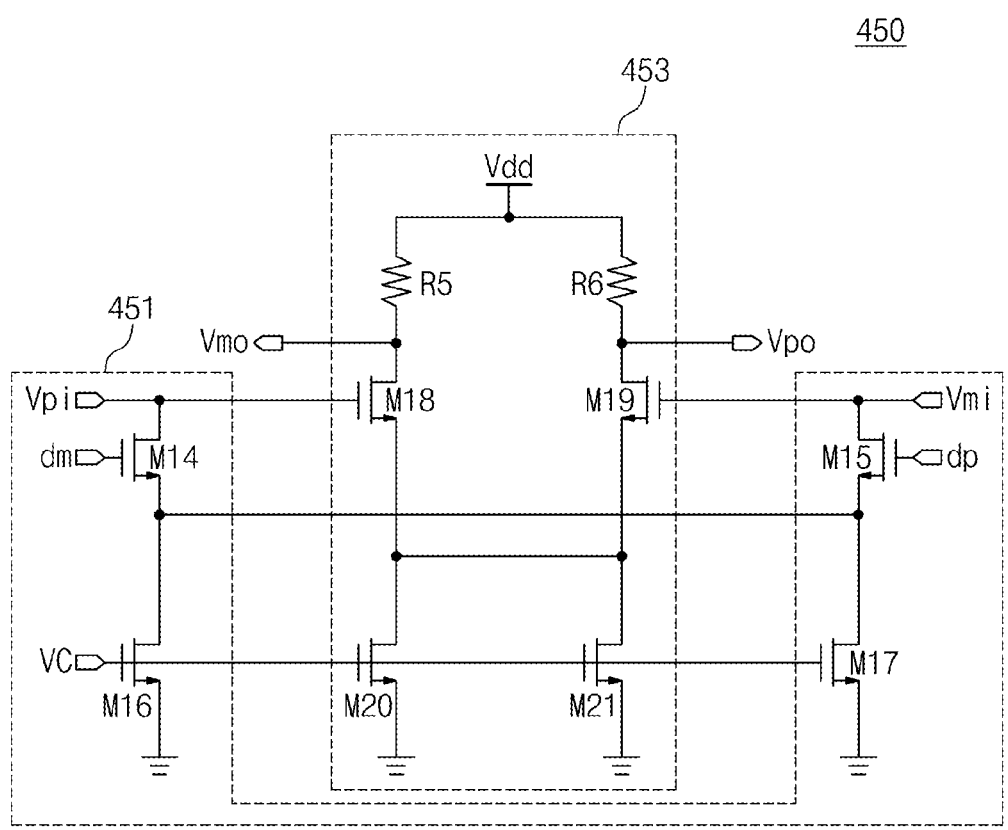
FIG. 5 is a circuit diagram illustrating a voltage amplifier receiving a DC offset removal signal according to an embodiment of the present invention.

FIG. 5 is a circuit diagram illustrating a voltage amplifier 450 receiving a DC-offset cancellation signal according to an embodiment of the present invention. Referring to FIG. 5, the second voltage amplifier 450 receives the DC-offset cancellation signals dp and dm from the DC-offset cancellation circuits 491 and 493. The second voltage amplifier 450 removes a DC-offset component in the differential signals Vpi and Vmi by using the DC-offset cancellation signals dm and dp. The second voltage amplifier 450 includes a first amplification unit 451 and a second amplification unit 453.

The first amplification unit 451 includes transistors M14 to M17. A first DC-offset cancellation signal dm is supplied to a gate of the 14th transistor M14. A drain of the 14th transistor M14 is connected to a gate of an 18th transistor M18 of the second amplification unit 453 and a first differential signal Vpi is supplied thereto. A source of the 14th transistor M14 is connected to a drain of the 16th transistor M16, a source of the 15th transistor M15, and a drain of the 17th transistor M17. A second DC-offset cancellation signal dp is supplied to a gate of the 15th transistor M15. A drain of the 15th transistor M15 is connected to a gate of a 19th transistor M19 of the second amplification unit 453 and a second differential signal Vmi is supplied thereto. The source of the 15th transistor M15 is connected to the drain of the 17th transistor M17, the source of the 14th transistor M14, and the drain of the 16th transistor M16.

A control voltage VC is supplied to a gate of the 16th transistor M16. The drain of the 16th transistor M16 is connected to the source of the 14th transistor M14, the source of a 15th transistor M15, and the drain of the 17th transistor M17. A source of the 16th transistor M16 is connected to a ground node. The control voltage VC is supplied to a gate of the 17th transistor M17. The drain of the 17th transistor M17 is connected to the source of the 15th transistor M15, the source of the 14th transistor M14, and the drain of the 16th transistor M16. A source of the 17th transistor M17 is connected to the ground node. Each of the 16th transistor M16 and the 17th transistor M17 may operate as a current source.

The second amplification unit 453 includes transistors M18 to M21. The gate of the 18th transistor M18 is connected to the drain of the 14th transistor M14 and the first differential signal Vpi is supplied thereto. A drain of the 18th transistor M18 is connected to an internal power node through the fifth resistor R5 and its signal is outputted as a differential signal Vmo. The internal power node may be a node where an internal power voltage Vdd of the IC chip 10 is supplied. A source of the 18th transistor M18 is connected to a drain of the 20th transistor M20 and a drain of the 21st transistor M21. The gate of the 19th transistor M19 is connected to the drain of the 15th transistor M15 and the second differential signal Vmi is supplied thereto. A drain of the 19th transistor M19 is connected to the internal power node through the sixth resistor R6 and its signal is outputted as a differential signal Vpo. The source of the 19th transistor M19 is connected to the drain of the 21st transistor M21 and the drain of the 20th transistor M20.

The control voltage VC is supplied to a gate of the 20th transistor M20. The drain of the 20th transistor M20 is connected to the source of the 18th transistor M18 and the source of the 19th transistor M19. A source of the 20th transistor M20 is connected to the ground node. The control voltage VC is supplied to a gate of the 21st transistor M21. The drain of the 21st transistor M21 is connected to the source of the 19th transistor M19 and the source of the 18th transistor M18. A source of the 21st transistor M21 is connected to the ground node. Each of the 20th transistor M20 and the 21st transistor M21 may operate as a current source.

At the first amplification terminal 451, by using the DC-offset cancellation signals dm and dp fed back through the DC-offset cancellation circuits 491 and 493, a DC-offset component in the differential signals Vpi and Vmi is removed. For example, the DC-offset cancellation signals dm and dp indicates DC components of a signal of the first differential amplifier and a signal of the second differential amplifier, which compare the differential input signals Vinp and Vinm of the buffer amplifier 200 or 300 with each bias voltage VB. According to the DC component of the first differential amplifier and the DC component of the second differential amplifier, a current amount of the first amplification unit 451 is adjusted, so that DC-offset components in the differential signals Vpi and Vmi may be removed. For example, a sensitivity for removing DC-offset components is proportional to an amplification gain of a fed back signal. Accordingly, signals of the input terminal of the buffer amplifier 480 having the largest amplification gain are fed back and provided to the first amplification terminal 451.

A buffer amplifier according to an embodiment of the present invention includes a two stage differential DC double balanced amplification terminal and minimize device mismatch, bandwidth reduction, and power consumption. A TIA including a buffer amplifier according to an embodiment of the present invention performs broadband signal transmission by preventing bandwidth reduction. Additionally, a TIA is configured to receive matching and power current from the outside through an output port of a buffer amplifier. As power matching errors are minimized, an internal feedback path is cut off. Therefore, the TIA may output signals having linearity without distortion. Additionally, a TIA is configured to feed back a signal outputted from an input terminal of a buffer amplifier to an amplification terminal to reduce DC-offset signals. As a result, the present invention provides a buffer amplifier having improved signal delivery performance and reduced input capacitance, providing linearity, and having low distortion characteristics and a trans-impedance amplifier including the buffer amplifier.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A buffer amplifier comprising:
    a replica bias unit dividing an internal power voltage received from an internal power node to generate a bias voltage;
    an input unit including a first differential amplifier comparing a first differential input signal with the bias voltage to output a first internal signal and a second differential amplifier comparing a second differential input signal with the bias voltage to output a second internal signal; and
    an output unit including a third differential amplifier comparing the first internal signal with the second internal signal to output a first differential output signal and a second differential output signal,
    wherein the first differential amplifier and the second differential amplifier drive the first internal signal and the second internal signal, respectively, by using an external power voltage received from an external power node separated from the internal power node; and the third differential amplifier drives the first differential output signal and the second differential output signal by using the external power voltage, and
    wherein the first to third differential amplifiers operate on the basis of current sources operating in response to a control voltage.

2. The buffer amplifier of claim 1, wherein the replica bias unit comprises:
    a first transistor having a drain and a gate connected to a first node and a source connected to a second node;
    a second transistor having a drain and a gate connected to the first node and a source connected to the second node;
    a resistor connected between the first node and the internal power node; and
    a current source connected between the second node and a ground node and operating in response to the control voltage, wherein a voltage of the first node is outputted as the bias voltage.

3. The buffer amplifier of claim 1, wherein the first differential amplifier comprises:
    a first transistor including a drain connected to a first external power node through a first resistor and a second impedance element, a source connected to a ground node through a first current source, and a gate where the first differential input signal is supplied; and
    a second transistor including a drain connected to a second external power node through a second resistor and a first impedance element, a source connected to the ground node through the first current source, and a gate where the bias voltage is supplied,
    wherein a signal of the drain of the first transistor and a signal of the drain of the second transistor are provided as the first internal signal and the second internal signal, respectively.

4. The buffer amplifier of claim 3, wherein the second differential amplifier comprises:
    a third transistor including a drain connected to the first external power node through the first resistor and the second impedance element, a source connected to the ground node through a second current source, and a gate where the bias voltage is supplied; and
    a fourth transistor including a drain connected to the second external power node through the second resistor and the first impedance element, a source connected to the ground node through the second current source, and a gate where the second differential input signal is supplied,
    wherein a signal of the drain of the third transistor and a signal of the drain of the fourth transistors are provided as the first internal signal and the second internal signal, respectively.

5. The buffer amplifier of claim 4, wherein the third differential amplifier comprises:
    a fifth transistor including a drain connected to the second external power node through the first impedance element, a gate connected to the drain of the first transistor and the drain of the third transistor, and a source connected to the ground node through a third current source; and
    a sixth transistor including a drain connected to the first external power node through the second impedance element, a gate connected to the drain of the second transistor and the drain of the fourth transistor, and a source connected to the ground node through a fourth current source,
    wherein a signal of the drain of the sixth transistor is provided as the first differential output signal and a signal of the drain of the fifth transistor is provided as the second differential output signal.

6. The buffer amplifier of claim 5, further comprising a source degeneration impedance element connected to the third differential amplifier, wherein the source degeneration impedance element comprises:
    a third and fourth resistors connected in series between the source of the fifth transistor and the source of the sixth transistor;
    a first capacitor connected between the source of the fifth transistor and the ground node; and
    a second capacitor connected between the source of the sixth transistor and the ground node.

7. The buffer amplifier of claim 4, wherein the replica bias unit comprises:
    a seventh transistor including a drain and a gate connected to a first node and a source connected to a second node;
    an eighth transistor including a drain and a gate connected to the first node and a source connected to the second node;
    a resistor connected between the first node and the internal power node; and
    a current source connected between the second node and the ground node and generating a same amount of positive current as the first current source and the second current source, wherein a size of each of the seventh transistor and the eighth transistor is identical to a size of each of the first transistor, the second transistor, the third transistor, and fourth transistor.

8. The buffer amplifier of claim 7, wherein an amount of current flowing through the resistor is identical to an amount of current flowing through the first resistor and an amount of current flowing through the second resistor.

9. The buffer amplifier of claim 3, wherein the first impedance element has a conjugate output matching value with the second external power node and the second impedance element has a conjugate output matching value with the first external power node.

10. A trans-impedance amplifier comprising:
a trans-impedance amplification device configured to convert a current signal received from an outside into a voltage signal and amplify the converted voltage signal;
a single to differential (S2D) amplifier configured to convert the voltage signal into a first differential signal and a second differential signal and amplify the converted signals;
a voltage amplifier configured to remove direct current (DC) components of the first differential signal and the second differential signal in response to a first DC-offset cancellation signal and a second DC-offset cancellation signal and amplifying the first differential signal and the second differential signal as a first differential input signal and a second differential input signal; and
a buffer configured to output the first differential input signal and the second differential input signal as a first differential output signal and a second differential output signal,
wherein the buffer comprises:
a replica bias unit dividing an internal power voltage received from an internal power node to generate a bias voltage;
an input unit including a first differential amplifier comparing the first differential input signal with the bias voltage to output a first internal signal and a second differential amplifier comparing the second differential input signal with the bias voltage to output a second internal signal; and
an output unit including a third differential amplifier comparing the first internal signal with the second internal signal to output the first differential output signal and the second differential output signal,
wherein the first differential amplifier and the second differential amplifier drive the first internal signal and the second internal signal, respectively, by using an external power voltage received from an external power node separated from the internal power node; and the third differential amplifier drives the first differential output signal and the second differential output signal by using the external power voltage.

11. The trans-impedance amplifier of claim 10, wherein the first differential amplifier comprises:
a first transistor including a drain connected to a first external power node through a first resistor and a second impedance element, a source connected to a ground node through a first current source, and a gate where the first differential input signal is supplied; and
a second transistor including a drain connected to a second external power node through a second resistor and a first impedance element, a source connected to the ground node through the first current source, and a gate where the bias voltage is supplied,
wherein a signal of the drain of the first transistor and a signal of the drain of the second transistor are provided as the first internal signal and the signal of the drain of the first transistor is provided as the second DC offset cancellation signal.

12. The trans-impedance amplifier of claim 11, wherein the second differential amplifier comprises:
a third transistor including a drain connected to the first external power node through the first resistor and the second impedance element, a source connected to the ground node through a second current source, and a gate where the bias voltage is supplied; and
a fourth transistor including a drain connected to the second external power node through the second resistor and the first impedance element, a source connected to the ground node through the second current source, and a gate where the second differential input signal is supplied,
wherein a signal of the drain of the third transistor and a signal of the drain of the fourth transistors are provided as the second internal signal and the signal of the drain of the fourth transistor is provided as the first DC-offset cancellation signal.

13. The trans-impedance amplifier of claim 12, wherein the trans-impedance amplifier, the S2D amplifier, the voltage amplifier, and the buffer form an integrated circuit chip and the drain of the fifth transistor and the drain of the sixth transistor are respectively connected to output pads exposed to an outside of the integrated circuit chip.

14. The trans-impedance amplifier of claim 13, wherein the first external power node and the second external power node are provided to an outside of the integrated circuit chip; the first impedance element is connected between the second external power node and an output pad outputting the second differential output signal among the output pads; and the second impedance element is connected between the first external power node and an output pad outputting the first differential output signal among the output pads.

15. The trans-impedance amplifier of claim 12, wherein the internal power voltage is a power voltage used in the integrated circuit chip; the trans-impedance amplifier, the S2D amplifier, and the voltage amplifier operate on the basis of the internal power voltage; the external power voltage is a power voltage supplied from an outside of the integrated circuit chip; and the buffer is configured to drive the first differential output signal and the second differential output signal by using the external power voltage.

16. The trans-impedance amplifier of claim 10,
wherein the voltage amplifier comprises a second input unit and a second output unit,
wherein the second input unit comprises:
a first transistor including a drain where the first differential signal is supplied, a gate where the second DC-offset cancellation signal is supplied, and a source connected to a ground node through a first current source; and
a second transistor including a drain where the second differential signal is supplied, a gate where the first DC-offset cancellation signal is supplied, and a source connected to the source of the first transistor and connected to the ground node through a second current source, and
the second output unit comprises:
a third transistor including a drain connected to the internal power node through a first resistor, a gate connected to the drain of the first transistor and receiving the first differential signal, and a source connected to the ground node through a third current source; and
a fourth transistor including a drain connected to the internal power node through a second resistor, a gate connected to the drain of the second transistor and receiving the second differential signal, and a source connected to the source of the third transistor and connected to the ground node through a fourth current source, wherein a signal of the drain of the fourth transistor is provided as the first differential input signal and a signal of the drain of the third transistor is provided as the second differential input signal.

\* \* \* \* \*